United States Patent
Veitschegger (10) Patent No.: US 10,141,238 B1
(45) Date of Patent: Nov. 27, 2018

(54) SEMICONDUCTOR POWER DEVICE INCLUDING ADJACENT THERMAL SUBSTRATE FOR THERMAL IMPEDANCE REDUCTION

(71) Applicant: Integra Technologies, Inc., El Segundo, CA (US)

(72) Inventor: William Veitschegger, Folsom, CA (US)

(73) Assignee: Integra Technologies, Inc., El Segundo, CA (US)

( * ) Notice: Subject to any disclaimer, the term of this patent is extended or adjusted under 35 U.S.C. 154(b) by 0 days.

(21) Appl. No.: 15/648,348

(22) Filed: Jul. 12, 2017

(51) Int. Cl.
*H01L 23/367* (2006.01)
*H01L 23/492* (2006.01)
*H01L 23/498* (2006.01)
*H01L 23/00* (2006.01)
*H01L 23/373* (2006.01)
*H01L 29/20* (2006.01)
*H01L 29/778* (2006.01)
*H01L 23/66* (2006.01)
*H01L 25/07* (2006.01)

(52) U.S. Cl.
CPC ........ *H01L 23/367* (2013.01); *H01L 23/3731* (2013.01); *H01L 23/3732* (2013.01); *H01L 23/492* (2013.01); *H01L 23/49827* (2013.01); *H01L 23/49833* (2013.01); *H01L 23/49844* (2013.01); *H01L 23/66* (2013.01); *H01L 24/48* (2013.01); *H01L 29/2003* (2013.01); *H01L 29/778* (2013.01); *H01L 25/072* (2013.01); *H01L 2223/6611* (2013.01); *H01L 2224/48091* (2013.01); *H01L 2224/48157* (2013.01); *H01L 2224/48221* (2013.01); *H01L 2924/1033* (2013.01); *H01L 2924/13064* (2013.01)

(58) Field of Classification Search
None
See application file for complete search history.

(56) References Cited

U.S. PATENT DOCUMENTS

2016/0268190 A1* 9/2016 Mcknight-Macneil ...................... H01L 23/49562

* cited by examiner

*Primary Examiner* — Eva Y Montalvo
*Assistant Examiner* — Kevin Quinto
(74) *Attorney, Agent, or Firm* — Loza & Loza, LLP; George Fountain (57) ABSTRACT

A semiconductor power device including a base plate, a semiconductor power die disposed on the base plate, an input lead by way the semiconductor power die receives an input signal, an output lead by way an output signal generated by the semiconductor power die is sent to another device, and at least one thermal substrate disposed on the base plate adjacent to the semiconductor power die, wherein a set of electrodes of the semiconductor power die are thermally and electrically coupled to a metallization layer on the thermal substrate. The thermal substrate may be comprised of a relatively high thermal conductivity material, such as beryllium-oxide (Be), silicon-carbide (SiC), diamond, aluminum nitride (AlN), or others. The thermal substrate produces at least one more heat path between the active region of the semiconductor power die and the base plate so as to reduce the effective thermal impedance.

16 Claims, 5 Drawing Sheets

SEMICONDUCTOR POWER DEVICE INCLUDING ADJACENT THERMAL SUBSTRATE FOR THERMAL IMPEDANCE REDUCTION

FIELD

Aspects of the present disclosure relate generally to semiconductor power devices, and more particularly, to a semiconductor power device including at least one adjacent thermal substrate for reducing the thermal impedance between an active region of a semiconductor power die and a thermal ground (e.g., a heat sink plate).

BACKGROUND

A semiconductor power device usually generates a substantial amount of heat at and near its active region. Usually, a maximum temperature, often termed the maximum junction temperature, is specified at which the temperature of the active region should not exceed so that the semiconductor power device is operated in a safe and reliable manner.

Generally, the semiconductor material used in the semiconductor power device are optimized for processing signals at high frequencies, such as radio frequency (RF), microwave, and millimeter wave, but not necessarily optimized to remove heat from the active region of the semiconductor power device. Accordingly, the effective thermal impedance through such semiconductor materials is generally undesirably high.

Thus, there is a need to decrease the effective thermal impedance to reduce the temperature of the active region or allow the semiconductor power device to operate at higher power configurations.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to a semiconductor power device including a base plate, at least one semiconductor power die disposed on the base plate, an input lead by way of the at least one semiconductor power die receives an input signal, an output lead by way an output signal generated by the semiconductor power device is sent to another device, and at least one thermal substrate disposed on the base plate and situated adjacent to the semiconductor power die, wherein a set of one or more electrodes of the semiconductor power die are thermally and electrically coupled to a metallization layer on the at least one thermal substrate. The at least one thermal substrate may be comprised of a relatively high thermal conductivity material, such as beryllium-oxide (Be), silicon-carbide (SiC), diamond, aluminum nitride (AlN), or others. The at least one thermal substrate produces at least one more heat path between the active region of the semiconductor power die and the base plate so as to reduce the effective thermal impedance between the active region and the base plate.

To the accomplishment of the foregoing and related ends, the one or more embodiments include the features herein-after fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

This disclosure describes a new method for reducing the thermal impedance associated with a semiconductor high power chip or die. The method entails conducting heat from a top surface or active region of the die using high thermal conductivity materials. The specific application described herein is for a high power radio frequency (RF) Gallium-Nitride (GaN) on Silicon-Carbide (SiC) die. However, this method could be applied to any high power die technology being used at any frequency from direct current (DC) to millimeter wave.

High power RF transistors have a maximum junction operating temperature for reliable operation. The junction temperature is determined by the power dissipation times the thermal impedance. In typical applications, the thermal impedance is determined by the heat flow from the device junction or active region near the top surface of the die, down through the die substrate material. Usually, the thermal conductivity of the substrate material is not very good, and it degrades as the die temperature increases.

The use of GaN on SiC to fabricate High Electron Mobility Transistors (HEMTs) enables much higher power densities than previous transistor technologies. The higher power densities also generate more heat in a smaller area due to internal dissipation. The smaller area of dissipation reduces the cross sectional area of the heat dissipation path, which increases the junction temperatures. This is better explained with reference to an exemplary semiconductor power device described as follows.

Figures 1A, 1B:
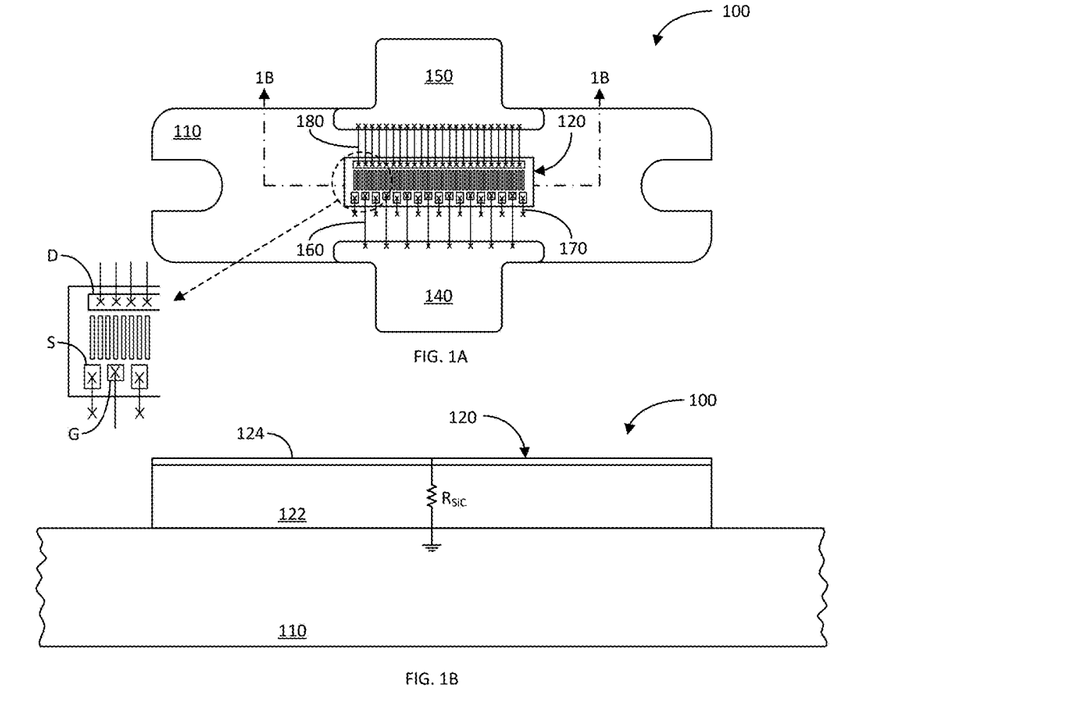
FIGS. 1A-1B illustrate top and cross-sectional views of an exemplary semiconductor power device in accordance with an aspect of the disclosure.

FIG. 1A illustrates a top view of an exemplary semiconductor power device 100 in accordance with an aspect of the disclosure. The semiconductor power device 100 includes a base plate 110 (e.g., a flange), a power semiconductor die 120 disposed on the base plate 110, an input lead 140 mounted on and electrically isolated from the base plate 110, and an output lead 150 also mounted on and electrically isolated from the base plate 110. In this example, the semiconductor power die 120 is configured as a field effect transistor (FET) type of device, such as a GaN on SiC HEMT, but other types of semiconductor devices are applicable to the concepts described herein.

Although not shown, the semiconductor power device 100 may include an electrically-insulating cover mounted on the base plate 110 so as to enclose the semiconductor power die 120 and proximate portions of the input and output leads 140 and 150. Further, the illustration shown in FIG. 1A (and FIG. 1B discussed below) may not be to scale. For example, the semiconductor power die 120 may be much smaller compared to the base plate, but is shown larger herein for description purposes. Additionally, depending on the output signal power requirement for the semiconductor power device 100, a plurality of semiconductor power dies 120 may be coupled in parallel between the input and output leads 140 and 150.

With further reference to FIG. 1B, which illustrates a cross-sectional view of the semiconductor power device 100 along line 1B-1B of FIG. 1A, the semiconductor power die 120 includes a SiC substrate 122 disposed on the base plate 110, and a GaN layer 124 disposed on the SiC substrate 122. As viewed from the top (and better depicted in the blow-up view shown in FIG. 1A), the top surface of the semiconductor power die 120 includes a set of gate electrodes (G), a set of source electrodes (S), and a drain electrode (D) disposed on the GaN layer 124.

The semiconductor power device 100 further includes a set of wirebonds or conductive-ribbons (generally, electrical conductors) 160 electrically coupling the input lead 140 to the set of gate electrodes (G) of the semiconductor power die 120. It shall be understood that there may be other components (e.g., resistor, capacitor, and/or inductor) coupled between the input lead 140 and the set of gate electrodes (G) of the semiconductor die 120, between the input lead 140 and the base plate 110, and/or the set of gate electrodes (G) and the base plate 110. Such components may be used to configure the semiconductor power device 100 with desirable characteristics, such as to improve the impedance match between the input of the semiconductor power device 100 and an input transmission line (not shown) coupled to the input lead 140.

Additionally, the semiconductor power device 100 includes another set of wirebonds or conductive-ribbons (generally electrical conductors) 170 electrically coupling the set of source electrodes (S) of the semiconductor power die 120 to the base plate 110 for electrical grounding purposes.

Also, the semiconductor power device 100 includes yet another set of wirebonds or conductive-ribbons (generally, electrical conductors) 180 electrically coupling the drain electrode (D) of the semiconductor power die 120 to the output lead 150. Similarly, it shall be understood that there may be other components (e.g., resistor, capacitor, and/or inductor) coupled between the drain electrode (D) of the semiconductor die 120 and the output lead 150, the drain electrode (D) and the base plate 110, and/or the base plate 110 and the output lead 150. Such components may be used to configure the semiconductor power device 100 with desirable characteristics, such as to improve the impedance match between the output of the semiconductor power device 100 and an output transmission line (not shown) coupled to the output lead 150.

As better illustrated in FIG. 1B, the relative thickness (although may not be to scale) between the GaN layer 124, the SiC substrate 122, and base plate 110 are shown. As an example, the GaN layer 124 may have a thickness of approximately one (1) micrometer (µm), the SiC substrate 122 may have a thickness of approximately 75 µm, and the base plate 110 may have a thickness of approximately 1000 µm. The base plate 110 may be made out of a high thermal conductivity material, such as a copper alloy.

Figure 1C:
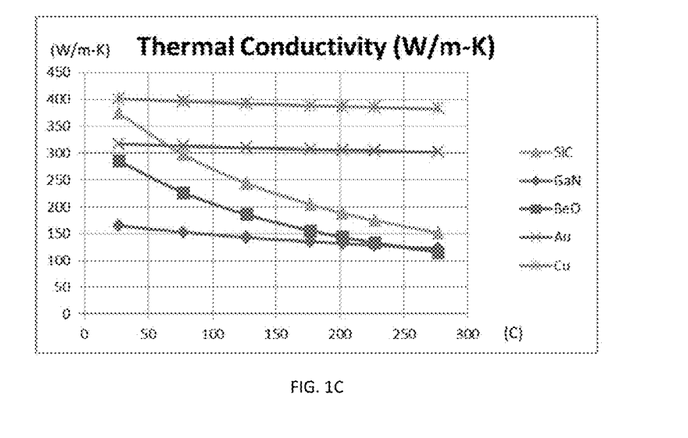
FIG. 1C illustrates a graph of thermal conductivity of several materials that may be used in connection with the exemplary semiconductor power devices described herein in accordance with another aspect of the disclosure.

FIG. 1C illustrates a graph of thermal conductivity of several materials that may be used in connection with the exemplary semiconductor power devices described herein in accordance with another aspect of the disclosure. The vertical or y-axis of the graph represents thermal conductivity in Watts per meter-Kelvin (W/m-K) with a scale extending from 0 to 450 W/m-K. The horizontal or x-axis of the graph represents temperature in Celsius (° C.) with a scale extending from 0° C. to 300° C.

As the graph illustrates, the copper-alloy material that may be used for the base plate 110 has the highest thermal conductivity at approximately 400 W/m-K, and stays relatively flat across the temperature range of 25° C. to 275° C. The GaN layer 124 has the lowest thermal conductivity at slightly above 150 W/m-K at 25° C. and gradually decreases to 125 W/m-K at 275° C. The SiC substrate 122 has a relatively high thermal conductivity at lower temperatures (e.g., 374 W/m-K at room temperature (e.g., 25° C.)) and decreases in a non-linear manner to 150 W/m-K at 275° C. Gold, which may be used for wirebonds and conductive-ribbons described herein, has the second highest thermal conductivity at slightly above 300 W/m-K, and also has a relatively flat variation across the temperature range of 25° C. to 275° C.

During operation, the top surface or active region (e.g., FET channel) of the GaN layer 124 may be operating at temperatures around 200° C., while the base plate 110 may be operating at temperatures around 60° C. At 200° C., both the GaN layer 124 and the SiC substrate 122 have relatively poor thermal conductivity (e.g., 140 and 180 W/m-K, respectively). Because the GaN layer 124 is very thin compared to the SiC substrate 122, the main contributor to the thermal impedance between the top surface or active region of the GaN layer 124 and the base plate 110 (which, because of its high thermal conductivity, substantially acts as a thermal ground) is the SiC substrate 122. Thus, as illustrated in FIG. 1B, the effective thermal impedance between the top surface of the GaN layer 124 and the base plate 110 is the thermal impedance $R_{SiC}$ of the SiC substrate 122.

As the thermal impedance $R_{SiC}$ of the SiC substrate 122 is relatively poor at high temperatures (e.g., around 200° C.), the semiconductor power device 100 may only be operated at safe junction temperature limited by the thermal impedance of the $R_{SiC}$ of the SiC substrate 122. Thus, there is a need to reduce the thermal impedance between the top surface or active region of the GaN layer 124 and the base plate 110 so that the semiconductor power device 100 may be operated at higher power configurations while maintaining the junction temperature within a safe temperature range.

Figure 2A:
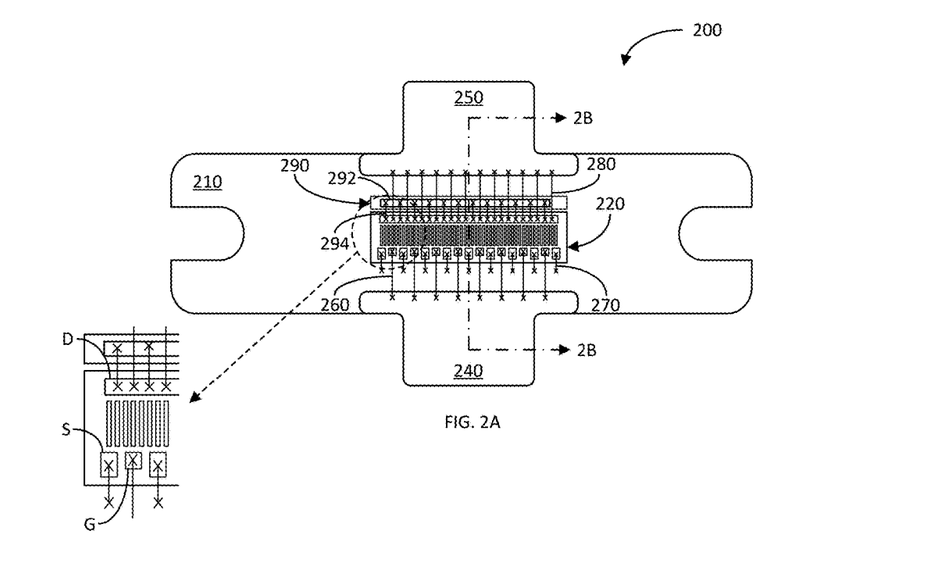
FIGS. 2A-2B illustrate top and cross-sectional views of another exemplary semiconductor power device in accordance with another aspect of the disclosure.

FIG. 2A illustrates a top view of another exemplary semiconductor power device 200 in accordance with another aspect of the disclosure. In summary, the semiconductor power device 200 is similar to that of semiconductor power device 100 but further includes an electrically-insulating thermal substrate situated adjacent to the semiconductor power die. A set of wirebonds or conductive-ribbons (generally electrical conductors) electrically attach the drain electrode (D) of the semiconductor power die to a top metallization layer on the thermal substrate.

The thermal substrate may be made out of a high thermal conductivity material, such as beryllium-oxide (BeO) (285 W/m-K), SiC (374 W/m-K @25° C.), diamond (1800 W/m-K), AlN (170 W/m-K) or others. The thermal impedance (e.g., $R_{Th}$) of the thermal substrate is in parallel with the thermal impedance (e.g., $R_{SiC}$) of the die substrate to reduce the effective thermal impedance $R_{eff}$ between the top surface or active region of the semiconductor power die and the base plate at substantially thermal ground.

In particular, the semiconductor power device 200 includes a base plate 210 (e.g., a flange), a semiconductor power die 220 disposed on the base plate 210, an input lead 240 mounted on and electrically isolated from the base plate 210, and an output lead 250 also mounted on and electrically isolated from the base plate 210. Again, in this example, the semiconductor power die 220 is configured as a GaN on SiC HEMT, but may be configured as another type of semiconductor device. As illustrated in the accompanying blow up view, the semiconductor power die 220 includes a set of gate electrodes (G), a set of source electrodes (S), and a drain electrode (D).

The semiconductor power device 200 further includes a thermal substrate 290 disposed on the base plate 210 adjacent to the drain-side of the semiconductor power die 220. The thermal substrate 290 includes a top metallization layer 292, which may be a continuous metallization pad as illustrated or a set of metallization pads (such as one pad for each wirebond attachment). As mentioned, the thermal substrate 290 may be comprised of BeO, SiC, diamond, AlN, or other suitable thermally-conductive material that prevents a short (e.g., mainly electrically-insulating) between the drain electrode (D) of the semiconductor power die 220 and the base plate 210.

The semiconductor power device 200 further includes a set of wirebonds or conductive-ribbons (generally, electrical conductors) 260 electrically coupling the input lead 240 to the set of gate electrodes (G) of the semiconductor power die 220, respectively. The semiconductor power die 220 receives an input signal from the input lead 240 via the set of electrical conductors 260. It shall be understood that there may be other components (e.g., resistor, capacitor, and/or inductor) coupled between the input lead 240 and the set of gate electrodes (G) of the semiconductor die 220, between the input lead 240 and the base plate 210, and/or the set of gate electrodes (G) and the base plate 210. Such components may be used to configure the semiconductor power device 200 with desirable characteristics, such as to improve the impedance match between the input of the semiconductor power device 200 and an input transmission line (not shown) coupled to the input lead 240.

Additionally, the semiconductor power device 200 includes another set of wirebonds or conductive-ribbons (generally, electrical conductors) 270 electrically coupling the set of source electrodes (S) of the semiconductor power die 220 to the base plate 210 for electrical grounding purposes.

Also, the semiconductor power device 200 includes yet another set of wirebonds or conductive-ribbons (generally, electrical conductors) 280 electrically coupling the drain electrode (D) of the semiconductor power die 220 to the output lead 250. The semiconductor power die 220 produces an output signal (based on the input signal (e.g., by amplifying the input signal)) at the output lead 250 via the set of electrical conductors 280. It shall be understood that there may be other components (e.g., resistor, capacitor, and/or inductor) coupled between the drain electrode (D) of the semiconductor die 220 and the output lead 250, between the drain electrode (D) and the base plate 210, and/or between the base plate 210 and the output lead 250. Such components may be used to configure the semiconductor power device 200 with desirable characteristics, such as to improve the impedance match between the output of the semiconductor power device 200 and an output transmission line (not shown) coupled to the output lead 250.

To reduce the thermal impedance between the top surface or active region of the semiconductor power die 220 and the base plate 210 at effectively thermal ground, the semiconductor power device 200 further includes a set of wirebonds or conductive ribbons (generally, electrical and/or thermal conductors) 294 electrically attaching the drain electrode (D) to the top metallization layer 292 of the thermal substrate 290. The thickness and type of metallization layer 292 of the thermal substrate 290 should be selected to improve the thermal heat transfer. For example, the metallization layer 292 may be comprised of copper, which has a thermal conductivity of around 390 W/m-K.

Additionally, the number of wirebonds 294 from the drain electrode (D) to the metallization layer 292 of the thermal substrate 290 should be as high as possible considering space restriction so as to maximize the bond cross-sectional area. For example, the minimum spacing between round wirebonds is about 0.004 inch. The number of gold wirebonds is made large as possible to conduct heat from the die to the thermal substrate. Gold has a thermal conductivity of 315 W/m-K, which is higher than BeO for example. There may be multiple wirebonds per pad if the metallization layer 294 comprises a plurality of separate metallization pads.

Figure 2B:
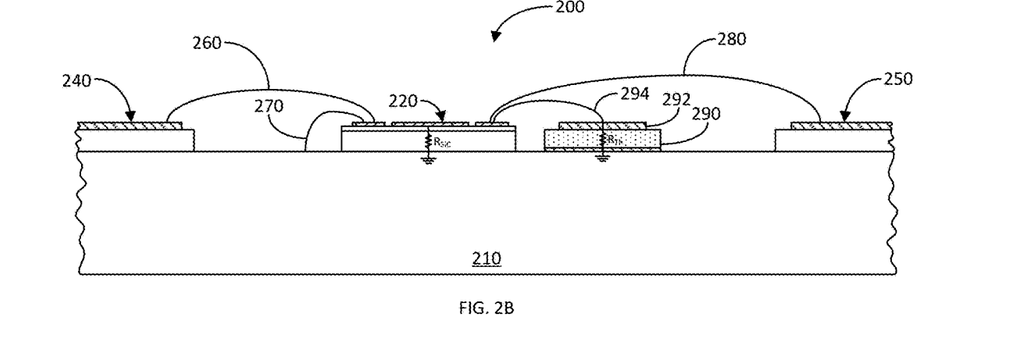

FIG. 2B illustrates a cross-sectional view of the semiconductor power device 200 along line 2B-2B as depicted in FIG. 2A. As illustrated, the semiconductor power device 200 includes the set of wirebonds 260 electrically connecting the input lead 240 to the set of gate electrodes (G) of the semiconductor power die 220. The semiconductor power device 200 also includes the set of wirebonds 270 electrically connecting the set of source electrodes (S) of the semiconductor power die 220 to the base plate 210 for electrical grounding purposes. Additionally, the semiconductor power device 200 includes the set of wirebonds 280 electrically connecting the drain electrode (D) of the semiconductor power die 220 to the output lead 250.

For reducing the thermal impedance between the top surface or active region of the semiconductor power device 220 and the base plate 210 at effectively thermal ground, the semiconductor power device 200 further includes the set of wirebonds 294 electrically connecting the drain electrode (D) of the semiconductor power die 220 to the top metallization layer 292 of the thermal substrate 290. In this configuration, there are now two primary heat paths from the top surface or active region of the semiconductor power die 220 to the base plate 210: (1) through the substrate of the semiconductor power die 220; and (2) through the thermal substrate 290.

As such, the effective thermal impedance $R_{eff}$ between the top surface or active region of the semiconductor power die 220 and the base plate 210 is the parallel combination of the thermal impedance $R_{SiC}$ of the substrate (e.g., SiC) of the semiconductor power die 220 and the thermal impedance $R_{Th}$ of the thermal substrate 290. As such, the effective parallel impedance $R_{eff}$ between the top surface or active region of the semiconductor power die 220 and the base plate 210 may be given by the following relationship:

$$R_{eff} = \frac{R_{SiC} \cdot R_{Th}}{R_{SiC} + R_{Th}} \quad \text{Eq. 1}$$

Because of this paralleling effect, the effective thermal impedance $R_{eff}$ may be substantially reduced to decrease the junction temperature of the semiconductor power die 220. This allows the semiconductor power die 220 to be operated at higher power configurations while maintaining the maximum junction temperature within a safe temperature range.

Figure 3A:
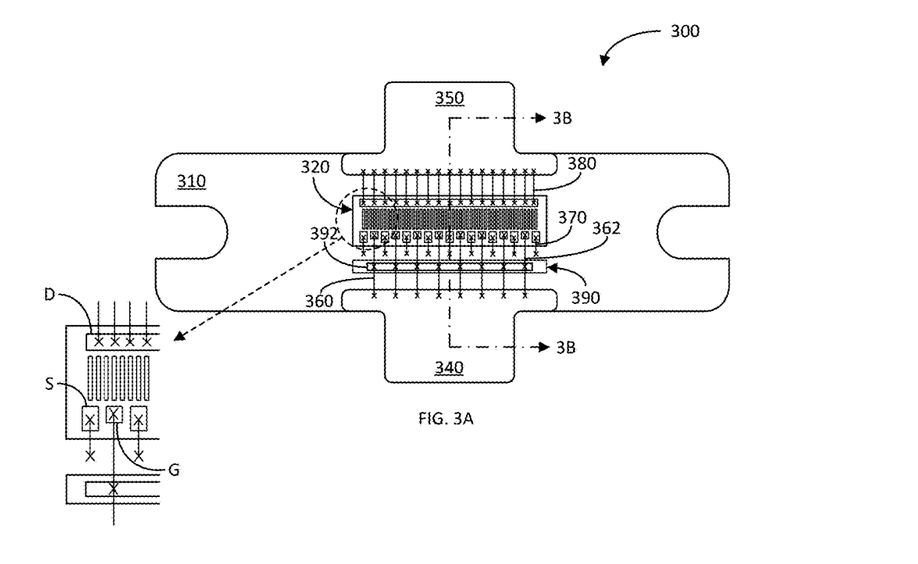
FIGS. 3A-3B illustrate top and cross-sectional views of another exemplary semiconductor power device in accordance with another aspect of the disclosure.

FIG. 3A illustrates a top view of another exemplary semiconductor power device 300 in accordance with another aspect of the disclosure. In summary, the semiconductor power device 300 is similar to that of semiconductor power device 200 but instead of including a thermal substrate thermally and electrically coupled to the drain electrode (D) of the semiconductor power die 220, the semiconductor power device 300 includes a thermal substrate thermally and electrically coupled to a set of gate electrodes (G) of a semiconductor power die. To effectuate this electrical and thermal coupling, a set of wirebonds or conductive-ribbons (generally, electrical conductors) electrically attach the set of gate electrodes (G) of the semiconductor power die to a top metallization layer of the thermal substrate.

In particular, the semiconductor power device 300 includes a base plate 310 (e.g., a flange), a power semiconductor die 320 disposed on the base plate 310, an input lead 340 mounted on and electrically isolated from the base plate 310, and an output lead 350 also mounted on and electrically isolated from the base plate 310. Again, in this example, the semiconductor power die 320 is configured as a GaN on SiC HEMT, but may be configured as another type of semiconductor device. As illustrated in the accompanying blow up view, the semiconductor power die 320 includes a set of gate electrodes (G), a set of source electrodes (S), and a drain electrode (D).

The semiconductor power device 300 further includes a thermal substrate 390 disposed on the base plate 310 adjacent to the gate/source-side of the semiconductor power die 320. The thermal substrate 390 includes a top metallization layer 392, which may be a continuous metallization pad as illustrated or a set of metallization pads (such as one pad for each wirebond attachment). As mentioned, the thermal substrate 390 may be comprised of BeO, SiC, diamond, AlN, or other suitable thermally-conductive material that prevents a short (e.g., mainly electrically-insulating) between the set of gate electrodes (G) of the semiconductor power die 320 and the base plate 310.

The semiconductor power device 300 further includes a set of wirebonds or conductive-ribbons (generally, electrical conductors) 360 electrically coupling the input lead 340 to the top metallization layer 392 of the thermal substrate 390. Additionally, the semiconductor power device 300 includes another set of wirebonds or conductive-ribbons (generally, electrical conductors) 362 electrically coupling the top metallization layer 392 of the thermal substrate 390 to the set of gate electrodes (G) of the semiconductor power die 320. In this configuration, the semiconductor power die 320 receives an input signal from the input lead 340 via the sets of electrical conductors 360 and 362.

It shall be understood that there may be other components (e.g., resistor, capacitor, and/or inductor) coupled between the input lead 340 and the metallization layer 392 of the thermal substrate 390, between the input lead 340 and the base plate 310, between the metallization layer 392 and the base plate 310, between the metallization layer 392 and the set of gate electrodes (G) of the semiconductor die 320, and/or between the set of gate electrodes (G) and the base plate 310. Such components may be used to configure the semiconductor power device 300 with desirable characteristics, such as to improve the impedance match between the input of the semiconductor power device 300 and an input transmission line (not shown) coupled to the input lead 340.

Additionally, the semiconductor power device 300 includes another set of wirebonds or conductive-ribbons (generally electrical conductors) 370 electrically coupling the set of source electrodes (S) of the semiconductor power die 320 to the base plate 310 for electrical grounding purposes.

Also, the semiconductor power device 300 includes yet another set of wirebonds or conductive-ribbons (generally, electrical conductors) 380 electrically coupling the drain electrode (D) of the semiconductor power die 320 to the output lead 350. The semiconductor power die 320 produces an output signal (based on the input signal (e.g., by amplifying the input signal)) at the output lead 350 via the set of electrical conductors 380. Similarly, it shall be understood that there may be other components (e.g., resistor, capacitor, and/or inductor) coupled between the drain electrode (D) of the semiconductor die 320 and the output lead 350, between the drain electrode (D) and the base plate 310, and/or between the base plate 310 and the output lead 350. Such components may be used to configure the semiconductor power device 300 with desirable characteristics, such as to improve the impedance match between the output of the semiconductor power device 300 and an output transmission line (not shown) coupled to the output lead 350.

To reduce the thermal impedance between the top surface or active region of the semiconductor power die 320 and the base plate 310 at effectively thermal ground, the thickness and type of metallization layer 392 of the thermal substrate 390 should be selected to improve the thermal heat transfer. For example, the metallization layer 392 may be comprised of copper. Additionally, the number of wirebonds 362 electrically coupling the set of gate electrodes (D) to the metallization layer 392 of the thermal substrate 390 should be as high as possible considering space restriction so as to maximize the bond cross-sectional area. For example, the minimum spacing between round wirebonds is about 0.004 inch. The number of gold wirebonds is made large as possible to conduct heat from the die to the thermal substrate. There may be multiple wirebonds per pad if the metallization layer 392 comprises a plurality of separate metallization pads.

Figure 3B:
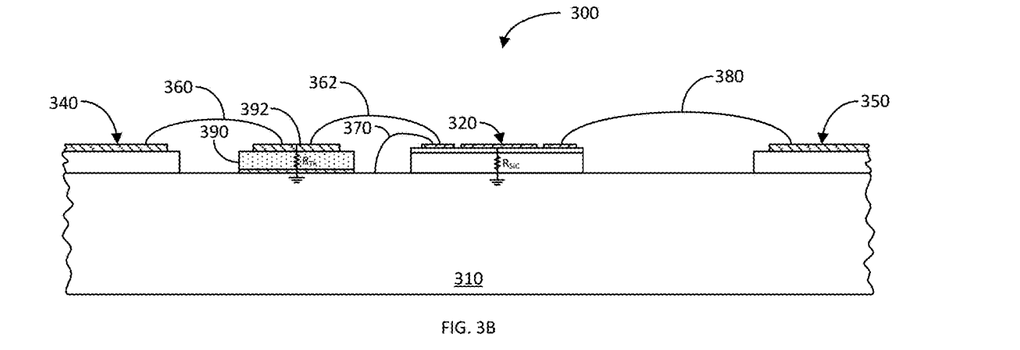

FIG. 3B illustrates a cross-sectional view of the semiconductor power device 300 along line 3B-3B as depicted in FIG. 3A. As illustrated, the semiconductor power device 300 includes the set of wirebonds 360 electrically connecting the input lead 340 to the top metallization layer 392 of the thermal substrate 390. The semiconductor power device 300 also includes the set of wirebonds 362 electrically connecting the top metallization layer 392 of the thermal substrate 390 to the set of gate electrodes (G) of the semiconductor power die 320. The semiconductor power device 300 also includes the set of wirebonds 370 electrically connecting the set of source electrodes (S) of the semiconductor power die 320 to the base plate 310 for electrical grounding purposes. Additionally, the semiconductor power device 300 includes the set of wirebonds 380 electrically connecting the drain electrode (D) of the semiconductor power die 320 to the output lead 350.

As shown, in this configuration, there are now two primary heat paths from the top surface or active region of the semiconductor power die 320 to the base plate 310: (1) through the substrate of the semiconductor power die 320; and (2) through the thermal substrate 390. As such, the effective thermal impedance $R_{eff}$ between the top surface or active region of the semiconductor power die 320 and the base plate 310 is the parallel combination of the thermal impedance $R_{SiC}$ of the substrate (e.g., SiC) of the semiconductor power die 320 and the thermal impedance $R_{Th}$ of the thermal substrate 390. As such, the effective parallel impedance $R_{eff}$ between the top surface or active region of the semiconductor power die 320 and the base plate 310 may be given by Eq. 1 previously discussed.

Again, because of this paralleling effect, the effective thermal impedance $R_{eff}$ may be substantially reduced to decrease the junction temperature of the semiconductor power die 320. This allows the semiconductor power die 320 to be operated at higher power configurations while maintaining the maximum junction temperature within a safe temperature range.

Figure 4A:
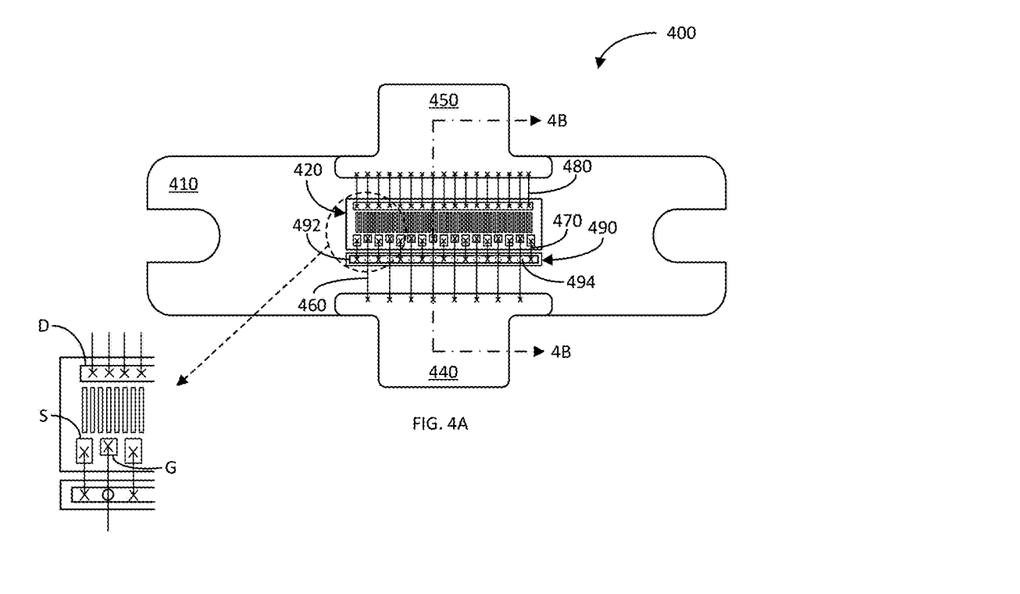
FIGS. 4A-4B illustrate top and cross-sectional views of another exemplary semiconductor power device in accordance with another aspect of the disclosure.

FIG. 4A illustrates a top view of another exemplary semiconductor power device 400 in accordance with another aspect of the disclosure. In summary, the semiconductor power device 400 is similar to that of semiconductor power device 300 but instead of including a thermal substrate thermally and electrically coupled to the set of gate electrodes (G) of the semiconductor power die 320, the semiconductor power device 400 includes a thermal substrate thermally and electrically coupled to a set of source electrodes (S) of a semiconductor power die. To effectuate this electrical and thermal coupling, a set of wirebonds or conductive-ribbons (generally electrical conductors) electrically attach the set of source electrodes (S) of the semiconductor power die to a top metallization layer on the thermal substrate.

In particular, the semiconductor power device 400 includes a base plate 410 (e.g., a flange), a semiconductor power die 420 disposed on the base plate 410, an input lead 440 mounted on and electrically isolated from the base plate 410, and an output lead 450 also mounted on and electrically isolated from the base plate 410. Again, in this example, the semiconductor power die 420 is configured as a GaN on SiC HEMT, but may be configured as another type of semiconductor device. As illustrated in the accompanying blow up view, the semiconductor power die 420 includes a set of gate electrodes (G), a set of source electrodes (S), and a drain electrode (D).

The semiconductor power device 400 further includes a thermal substrate 490 disposed on the base plate 410 adjacent to the gate/source-side of the semiconductor power die 420. The thermal substrate 490 includes a top metallization layer 492, which may be a continuous metallization pad as illustrated or a set of metallization pads (such as one pad for each wirebond attachment). Additionally, for effectuating an electrical grounding of the set of source electrodes (S) of the semiconductor power die 420, the thermal substrate 490 includes a set of metalized via holes 494 electrically connecting the top metallization layer 492 to a bottom metallization layer, which is used to attach the thermal substrate 490 to the base plate 410. As mentioned, the thermal substrate 490 may be comprised of BeO, SiC, diamond, AlN, or other suitable thermally-conductive material.

The semiconductor power device 400 further includes a set of wirebonds or conductive-ribbons (generally, electrical conductors) 460 electrically coupling the input lead 440 to the set of gate electrodes (G) of the semiconductor power die 420, respectively. The semiconductor power die 420 receives an input signal from the input lead 440 via the set of electrical conductors 460. It shall be understood that there may be other components (e.g., resistor, capacitor, and/or inductor) coupled between the input lead 440 and the set of gate electrodes (G) of the semiconductor die 420, between the input lead 440 and the base plate 410, and/or between the set of gate electrodes (G) and the base plate 410. Such components may be used to configure the semiconductor power device 400 with desirable characteristics, such as to improve the impedance match between the input of the semiconductor power device 400 and an input transmission line (not shown) coupled to the input lead 440.

Additionally, the semiconductor power device 400 includes another set of wirebonds or conductive-ribbons (generally, electrical conductors) 470 electrically coupling the set of source electrodes (S) of the semiconductor power die 420 to the top metallization layer 492 of the thermal substrate 490. As discussed, the set of source electrodes (S) of the semiconductor power die 420 are electrically coupled to the base plate 410 for electrical grounding purpose via the metallized via holes 494 through the thermal substrate 490.

Also, the semiconductor power device 400 includes yet another set of wirebonds or conductive-ribbons (generally, electrical conductors) 480 electrically coupling the drain electrode (D) of the semiconductor power die 420 to the output lead 450. The semiconductor power die 420 produces an output signal (based on the input signal (e.g., by amplifying the input signal)) at the output lead 450 via the set of electrical conductors 480. It shall be understood that there may be other components (e.g., resistor, capacitor, and/or inductor) coupled between the drain electrode (D) of the semiconductor die 420 and the output lead 450, between the drain electrode (D) and the base plate 410, and/or between the base plate 410 and the output lead 450. Such components may be used to configure the semiconductor power device 400 with desirable characteristics, such as to improve the impedance match between the output of the semiconductor power device 400 and an output transmission line (not shown) coupled to the output lead 450.

To reduce the thermal impedance between the top surface or active region of the semiconductor power die 420 and the base plate 410 at effectively thermal ground, the thickness and type of metallization layer 492 and the metalized via holes 494 of the thermal substrate 490 should be selected to improve the thermal heat transfer. For example, the metallization layer 492 and the metalized via holes 494 may be comprised of copper. Additionally, the number of wirebonds 470 from the set of source electrodes (S) to the metallization layer 492 of the thermal substrate 490 should be as high as possible considering space restriction so as to maximize the bond cross-sectional area. For example, the minimum spacing between round wirebonds is about 0.004 inch. The number of gold wirebonds is made large as possible to conduct heat from the die to the thermal substrate. There may be multiple wirebonds per pad if the metallization layer 492 comprises a plurality of separate metallization pads.

Figure 4B:
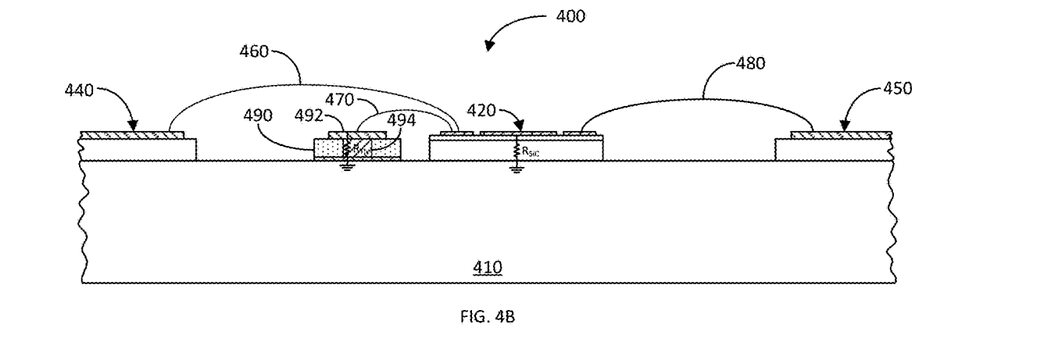

FIG. 4B illustrates a cross-sectional view of the semiconductor power device 400 along line 4B-4B as depicted in FIG. 4A. As illustrated, the semiconductor power device 400 includes the set of wirebonds 460 electrically connecting the input lead 440 to the set of gate electrodes (G) of the semiconductor power die 420. The semiconductor power device 400 also includes the set of wirebonds 470 electrically connecting the source electrode (S) of the semiconductor power die 420 to the top metallization layer 492 of the thermal substrate 490 for electrical grounding purposes via the metalized via holes 494 through the thermal substrate 490. Additionally, the semiconductor power device 400 includes the set of wirebonds 480 electrically connecting the drain electrode (D) of the semiconductor power die 420 to the output lead 450.

In this configuration, there are now two primary heat paths from the top surface or active region of the semiconductor power die 420 to the base plate 410: (1) through the substrate of the semiconductor power die 420; and (2) through the thermal substrate 490. As such, the effective thermal impedance $R_{\it{eff}}$ between the top surface or active region of the semiconductor power die 420 and the base plate 410 is the parallel combination of the thermal impedance $R_{SiC}$ of the substrate (e.g., SiC) of the semiconductor power die 420 and the thermal impedance $R_{Th}$ of the thermal substrate 490. As such, the effective parallel impedance $R_{\it{eff}}$ between the top surface or active region of the semiconductor power die 420 and the base plate 410 may be given by Eq. 1 previously discussed.

Again, because of this paralleling effect, the effective thermal impedance $R_{\it{eff}}$ may be substantially reduced to decrease the junction temperature of the semiconductor power die 420. This allows the semiconductor power die 420 to be operated at higher power configurations while maintaining the maximum junction temperature within a safe temperature range.

Figure 5A:
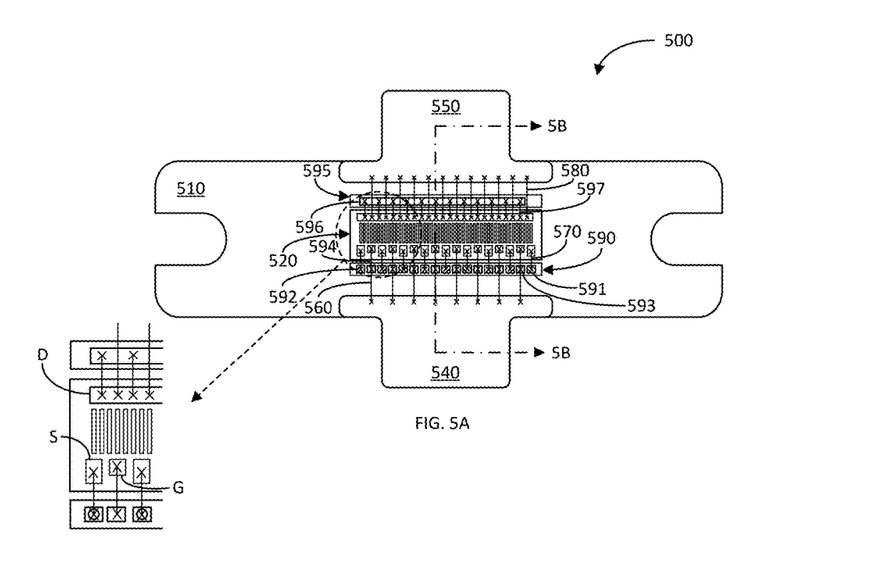
FIGS. 5A-5B illustrate top and cross-sectional views of another exemplary semiconductor power device in accordance with another aspect of the disclosure.

FIG. 5A illustrates a top view of another exemplary semiconductor power device 500 in accordance with another aspect of the disclosure. In semiconductor power device 200, the thermal substrate 290 was coupled to the drain electrode (D) of the semiconductor power die 220. In semiconductor power device 300, the thermal substrate 390 was coupled to the set of gate electrodes (G) of the semiconductor power die 320. And, in semiconductor power device 400, the thermal substrate 490 was coupled to the set of source electrodes (S) of the semiconductor power die 420.

It shall be understood that one or more thermal substrates may be used to thermally couple to any combination of the gate electrodes (G), source electrodes (S) and drain electrode (D) of a semiconductor power die. As an example of this, the semiconductor power device 500 includes a first thermal substrate electrically and thermally coupled to the gate electrodes (G) and the source electrodes (S) and a second thermal substrate is used to connect to the drain electrode (D).

More specifically, the semiconductor power device 500 includes a base plate 510 (e.g., a flange), a semiconductor power die 520 disposed on the base plate 510, an input lead 540 mounted on and electrically isolated from the base plate 510, and an output lead 550 also mounted on and electrically isolated from the base plate 510. Again, in this example, the semiconductor power die 520 is configured as a GaN on SiC HEMT, but may be configured as another type of semiconductor device. As illustrated in the accompanying blow up view, the semiconductor power die 520 includes a set of gate electrodes (G), a set of source electrodes (S), and a drain electrode (D).

The semiconductor power device 500 further includes a first thermal substrate 590 disposed on the base plate 510 adjacent to the gate/source-side of the semiconductor power die 520. The first thermal substrate 590 includes a first set of top metallization pads 591 coupled to the set of source electrodes (S), respectively. A set of metalized via holes 592 through the first thermal substrate 590 electrically couple the first set of top metallization pads 591 to the base plate 510. This provides the electrical grounding for the set of source electrodes (S) of the semiconductor power die 520.

The first thermal substrate 590 includes a second set of top metallization pads 593 coupled to the set of gate electrodes (G), respectively. The thermally-insulating material of the first thermal substrate 590 electrically isolates the first set of top metallization pads 591 from the second set of top metallization pads 593. The first thermal substrate 590 may be comprised of BeO, SiC, diamond, AlN, or other suitable thermally-conductive material.

The semiconductor power device 500 further includes a second thermal substrate 595 disposed on the base plate 510 adjacent to the drain-side of the semiconductor power die 520. The second thermal substrate 595 includes a top metallization layer 596 coupled to the drain electrode (D) of the semiconductor power die 520. The second thermal substrate 595 may be comprised of BeO, SiC, diamond, AlN, or other suitable thermally-conductive material.

The semiconductor power device 500 further includes a set of wirebonds or conductive-ribbons (generally, electrical conductors) 560 electrically coupling the input lead 540 to the second set of top metallization pads 593 of the first thermal substrate 590, respectively. The semiconductor power device 500 also includes a set of wirebonds or conductive-ribbons (generally, electrical conductors) 594 electrically coupling the second set of top metallization pads 593 of the set of gate electrodes (G), respectively. In this configuration, the semiconductor power die 520 receives an input signal from the input lead 540 via the sets of electrical conductors 560 and 594.

It shall be understood that there may be other components (e.g., resistor, capacitor, and/or inductor) coupled between the input lead 540 and the set of gate electrodes (G) of the semiconductor die 520, between the input lead 540 and the base plate 510, and/or between the set of gate electrodes (G) and the base plate 510. Such components may be used to configure the semiconductor power device 500 with desirable characteristics, such as to improve the impedance match between the input of the semiconductor power device 500 and an input transmission line (not shown) coupled to the input lead 540.

Additionally, the semiconductor power device 500 includes another set of wirebonds or conductive-ribbons (generally electrical conductors) 570 electrically coupling the set of source electrodes (S) of the semiconductor power die 520 to the first set of top metallization pads 591 of the first thermal substrate 590. As discussed, the set of source electrodes (S) of the semiconductor power die 520 are electrically coupled to the base plate 510 for electrical grounding purpose via the metallized via holes 592 through the first thermal substrate 590.

Also, the semiconductor power device 500 includes yet another set of wirebonds or conductive-ribbons (generally, electrical conductors) 580 electrically coupling the drain electrode (D) of the semiconductor power die 520 to the output lead 550. The semiconductor power die 520 produces an output signal (based on the input signal (e.g., by amplifying the input signal)) at the output lead 550 via the set of electrical conductors 580. It shall be understood that there may be other components (e.g., resistor, capacitor, and/or inductor) coupled between the drain electrode (D) of the semiconductor die 520 and the output lead 550, between the drain electrode (D) and the base plate 510, and/or between the base plate 510 and the output lead 550. Such components may be used to configure the semiconductor power device 500 with desirable characteristics, such as to improve the impedance match between the output of the semiconductor power device 500 and an output transmission line (not shown) coupled to the output lead 550.

The semiconductor power device 500 includes another set of wirebonds or conductive-ribbons (generally, electrical conductors) 597 electrically coupling the drain electrode (D) of the semiconductor power die 520 to the top metallization layer 596 of the second thermal substrate 595.

Figure 5B:
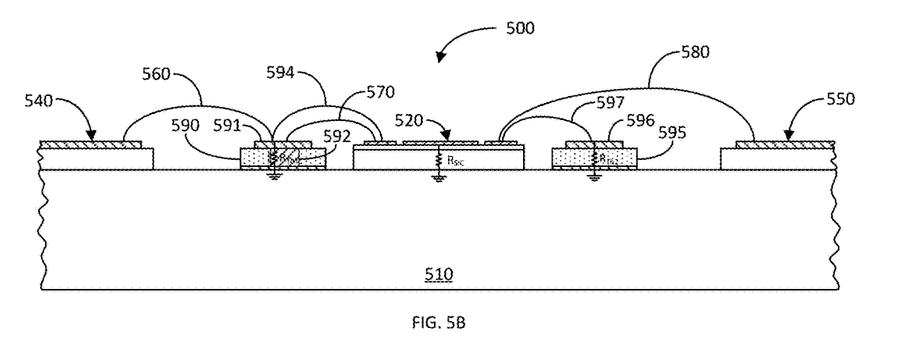

FIG. 5B illustrates a cross-sectional view of the semiconductor power device 500 along line 5B-5B as depicted in FIG. 5A. As illustrated, the semiconductor power device 500 includes the set of wirebonds 560 electrically connecting the input lead 540 to the second set of top metallization pads 593 of the first thermal substrate 590. The semiconductor power device 500 also includes the set of wirebonds 594 electrically connecting the second set of top metallization pads 593 of the first thermal substrate 590 to the set of gate electrodes (G) of the semiconductor power die 520, respectively.

The semiconductor power device 500 also includes the set of wirebonds 570 electrically connecting the set of source electrode (S) of the semiconductor power die 520 to the first set of top metallization pads 591 of the first thermal substrate 590 for electrical grounding purposes via the metalized via holes 592 through the thermal substrate 590. Additionally, the semiconductor power device 500 includes the set of wirebonds 580 electrically connecting the drain electrode (D) of the semiconductor power die 520 to the output lead 550. The semiconductor power die 520 also includes the set of wirebonds 597 electrically connecting the drain electrode (D) to the top metallization layer 596 of the second thermal substrate 595.

In this configuration, there are now three primary heat paths from the top surface or active region of the semiconductor power die 520 to the base plate 510: (1) through the substrate of the semiconductor power die 520; (2) through the first thermal substrate 590; and (3) through the second thermal substrate 595.

As such, the effective thermal impedance $R_{eff}$ between the top surface or active region of the semiconductor power die 520 and the base plate 510 is the parallel combination of the thermal impedance $R_{SiC}$ of the substrate (e.g., SiC) of the semiconductor power die 520, the thermal impedance $R_{Th1}$ of the first thermal substrate 590, and the thermal impedance $R_{Th2}$ of the second thermal substrate 595. As such, the effective parallel impedance $R_{eff}$ between the top surface or active region of the semiconductor power die 520 and the base plate 510 may be given by the following equation:

$$\frac{1}{R_{eff}} = \frac{1}{R_{SiC}} + \frac{1}{R_{Th1}} + \frac{1}{R_{Th2}} \qquad \text{Eq. 2}$$

Again, because of this paralleling effect, the effective thermal impedance $R_{eff}$ may be substantially reduced to decrease the junction temperature of the semiconductor power die 520. This allows the semiconductor power die 520 to be operated at higher power configurations while maintaining the maximum junction temperature within a safe temperature range.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A semiconductor power device, comprising:
    a base plate;
    an input lead disposed on and electrically isolated from the base plate;
    an output lead disposed on and electrically isolated from the base plate;
    a semiconductor power die disposed on the base plate, wherein the semiconductor power die is configured to receive an input signal from the input lead and generate an output signal at the output lead, and wherein the semiconductor power die comprises a field effect transistor (FET); and
    a thermal substrate thermally and electrically coupled to a first set of one or more electrodes on the semiconductor power die to reduce a temperature of an active region of the semiconductor power die, wherein the first set of one or more electrodes comprises a set of one or more drain electrodes, wherein the thermal substrate comprises a top metallization layer, and wherein a first set of one of more electrical conductors electrically couple the set of one or more drain electrodes to the top metallization layer of the thermal substrate.

2. The semiconductor power device of claim 1, wherein the set of one or more electrical conductors comprises a set of one or more wirebonds or conductive-ribbons.

3. The semiconductor power device of claim 1, further comprising a second set of one or more electrical conductors electrically coupling the set of one or more drain electrodes to the output lead.

4. The semiconductor power device of claim 3, wherein the thermal substrate comprises a beryllium oxide (BeO) material, a silicon carbide (SiC) material, diamond, or aluminum nitride (AlN).

5. The semiconductor power device of claim 4, wherein the semiconductor power die comprises:
    a silicon carbide (SiC) substrate disposed on the base plate; and
    a gallium nitride (GaN) layer disposed on the SiC substrate, wherein the active region is situated within the GaN layer.

6. A semiconductor power device, comprising:
    a base plate;
    an input lead disposed on and electrically isolated from the base plate;
    an output lead disposed on and electrically isolated from the base plate;
    a semiconductor power die disposed on the base plate, wherein the semiconductor power die is configured to receive an input signal from the input lead and generate an output signal at the output lead, wherein the semiconductor power die comprises a field effect transistor (FET); and
    a thermal substrate thermally and electrically coupled to a first set of one or more electrodes on the semiconductor power die to reduce a temperature of an active region of the semiconductor power die, wherein the first set of one or more electrodes comprises a set of one or more gate electrodes of the FET, wherein the thermal substrate comprises a top metallization layer, and wherein a first set of one of more electrical conductors electrically couple the set of one or more gate electrodes to the top metallization layer of the thermal substrate.

7. The semiconductor power device of claim 6, further comprising a second set of one or more electrical conductors electrically coupling the input lead to the set of one or more gate electrodes.

8. The semiconductor power device of claim 7, wherein the thermal substrate comprises a beryllium oxide (BeO) material, a silicon carbide (SiC) material, diamond, aluminum nitride (AlN).

9. The semiconductor power device of claim 8, wherein the semiconductor power die comprises:
   a silicon carbide (SiC) substrate disposed on the base plate; and
   a gallium nitride (GaN) layer disposed on the SiC substrate, wherein the active region is situated within the GaN layer.

10. A semiconductor power device, comprising:
    a base plate;
    an input lead disposed on and electrically isolated from the base plate;
    an output lead disposed on and electrically isolated from the base plate;
    a semiconductor power die disposed on the base plate, wherein the semiconductor power die is configured to receive an input signal from the input lead and generate an output signal at the output lead, wherein the semiconductor power die comprises a field effect transistor (FET); and
    a thermal substrate thermally and electrically coupled to a first set of one or more electrodes on the semiconductor power die to reduce a temperature of an active region of the semiconductor power die, wherein the first set of one or more electrodes comprises a set of one or more source electrodes of the FET, wherein the thermal substrate comprises a top metallization layer and a set of one or more metallized via holes, wherein a set of one of more electrical conductors electrically couple the set of one or more source electrodes to the base plate via the top metallization layer and the set of metallized via holes of the thermal substrate.

11. The semiconductor power device of claim 10, wherein the thermal substrate comprises a beryllium oxide (BeO) material, a silicon carbide (SiC) material, diamond, or aluminum nitride (AlN).

12. The semiconductor power device of claim 11, wherein the semiconductor power die comprises:
    a silicon carbide (SiC) substrate disposed on the base plate; and
    a gallium nitride (GaN) layer disposed on the SiC substrate, wherein the active region is situated within the GaN layer.

13. A semiconductor power device, comprising:
    a base plate;
    an input lead disposed on and electrically isolated from the base plate;
    an output lead disposed on and electrically isolated from the base plate;
    a semiconductor power die disposed on the base plate, wherein the semiconductor power die includes a set of one or more gate electrodes configured to receive an input signal by way of the input lead, a set of one or more source electrodes electrically coupled to the base plate, and a set of one or more drain electrodes configured to produce an output signal at the output lead;
    a first thermal substrate disposed on the base plate, and thermally and electrically coupled to the set of one or more gate electrodes or the set of one or more source electrodes to reduce a temperature of an active region of the semiconductor power die; and
    a second thermal substrate disposed on the base plate, and thermally and electrically coupled to the set of one or more drain electrodes to reduce the temperature of the active region of the semiconductor power die.

14. The semiconductor power device of claim 13, wherein the thermal substrate comprises a beryllium oxide (BeO) material, a silicon carbide (SiC) material, diamond, or aluminum nitride (AlN).

15. The semiconductor power device of claim 13, further comprising:
    a first set of one or more electrical conductors by way the set of one or more gate electrodes receive the input signal from the input lead;
    a second set of one or more electrical conductors electrically connecting the set of one or more gate electrodes to a first set of one or more metallization pads on the first thermal substrate;
    a third set of one or more electrical conductors electrically connecting the set of one or more source electrodes to a second set of one or more metallization pads on the first thermal substrate, wherein the first thermal substrate comprises a set of metallized via holes electrically connecting the second set of one or more metallization pads to the base plate;
    a fourth set of one or more electrical conductors by way the set of one or more drain electrodes produce the output signal at the output lead; and
    a fifth set of one or more electrical conductors electrically connecting the set of one or more drain electrodes to a top metallization layer of the second thermal substrate.

16. A gallium-nitride (GaN) on silicon carbide (SiC) high electron mobility transistor (HEMT), comprising:
    a base plate;
    an input lead disposed on and electrically isolated from the base plate;
    an output lead disposed on and electrically isolated from the base plate;
    a semiconductor power die disposed on the base plate, wherein the semiconductor power die includes a set of one or more gate electrodes configured to receive an input signal by way of the input lead, a set of one or more source electrodes electrically coupled to the base plate, and a set of one or more drain electrodes configured to produce an output signal at the output lead;
    a first thermal substrate disposed on the base plate, and thermally and electrically coupled to the set of one or more gate electrodes to reduce a temperature of an active region of the semiconductor power die;
    a second thermal substrate disposed on the base plate, and thermally and electrically coupled to the set of one or more drain electrodes to reduce the temperature of the active region of the semiconductor power die;
    a first set of one or more electrical conductors by way the set of one or more gate electrodes receive the input signal from the input lead;
    a second set of one or more electrical conductors electrically connecting the set of one or more gate electrodes to a metallization layer on the first thermal substrate;

a third set of one or more electrical conductors electrically connecting the set of one or more source electrodes to the base plate;
a fourth set of one or more electrical conductors by way the set of one or more drain electrodes produce the output signal at the output lead; and
a fifth set of one or more electrical conductors electrically connecting the set of one or more drain electrodes to a second metallization layer of the second thermal substrate.

* * * * *